US009123658B2

(12) United States Patent
Abdallah et al.

(10) Patent No.: US 9,123,658 B2
(45) Date of Patent: *Sep. 1, 2015

(54) GRAPHO-EPITAXY DSA PROCESS WITH DIMENSION CONTROL OF TEMPLATE PATTERN

(71) Applicant: INTERNATIONAL BUSINESS MACHINES CORPORATION, Armonk, NY (US)

(72) Inventors: Jassem A. Abdallah, Albany, NY (US); Matthew E. Colburn, Schenectady, NY (US); Steven J. Holmes, Albany, NY (US); Chi-Chun Liu, San Jose, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/327,968

(22) Filed: Jul. 10, 2014

(65) Prior Publication Data

US 2014/0322917 A1     Oct. 30, 2014

Related U.S. Application Data

(63) Continuation of application No. 13/868,564, filed on Apr. 23, 2013, now Pat. No. 8,853,085.

(51) Int. Cl.
*H01L 21/311* (2006.01)
*H01L 21/308* (2006.01)
*H01L 21/3065* (2006.01)

(52) U.S. Cl.
CPC ........ *H01L 21/3086* (2013.01); *H01L 21/3065* (2013.01); *H01L 21/3081* (2013.01)

(58) Field of Classification Search
USPC ........................................................ 438/694
See application file for complete search history.

(56) References Cited

U.S. PATENT DOCUMENTS

| 7,601,641 | B1 | 10/2009 | Geiss et al. |
| 8,039,326 | B2 | 10/2011 | Knorr et al. |
| 8,853,085 | B1* | 10/2014 | Abdallah et al. ............. 438/694 |
| 2008/0274413 | A1* | 11/2008 | Millward ......................... 430/5 |

(Continued)

OTHER PUBLICATIONS

Caykara, T., et al. "UV Degradation of Poly(Methyl Methacrylate) and Its Vinyltriethoxysilane Containing Copolymers" Polymer Degradation and Stability, vol. 65. Aug. 1999. pp. 225-229.

(Continued)

*Primary Examiner* — Asok K Sarkar
(74) *Attorney, Agent, or Firm* — Tutunjian & Bitetto, P.C.; Yuanmin Cai

(57) ABSTRACT

A method for defining a template for directed self-assembly (DSA) materials includes patterning a resist on a stack including an ARC and a mask formed over a hydrophilic layer. A pattern is formed by etching the ARC and the mask to form template lines which are trimmed to less than a minimum feature size (L). Hydrophobic spacers are formed on the template lines and include a fractional width of L. A neutral brush layer is grafted to the hydrophilic layer. A DSA material is deposited between the spacers and annealed to form material domains in a form of alternating lines of a first and a second material wherein the first material in contact with the spacers includes a width less than a width of the lines. A metal is added to the domains forming an etch resistant second material. The first material and the spacers are removed to form a DSA template pattern.

20 Claims, 3 Drawing Sheets

(56) References Cited

U.S. PATENT DOCUMENTS

| | | | |
|---|---|---|---|
| 2011/0111596 | A1 | 5/2011 | Kanakasabapathy |
| 2012/0061807 | A1 | 3/2012 | Tran |
| 2012/0244458 | A1 | 9/2012 | Luong et al. |
| 2012/0244711 | A1 | 9/2012 | Yin et al. |
| 2012/0276735 | A1 | 11/2012 | Tagami |
| 2013/0183827 | A1* | 7/2013 | Millward .................. 438/694 |
| 2014/0069325 | A1* | 3/2014 | Kawanishi .................. 117/54 |

OTHER PUBLICATIONS

Choi, J., et al. "Degradation of Poly(Methylmethacrylate) by Deep Ultraviolet, X-Ray, Electron Beam, and Proton Beam Irradiations" Journal of Vacuum Science & Technology B: Microelectronics and Nanometer Structures, vol. 6, Issue 6. Nov. 1988. pp. 2286-2289.

Jarnagin, N., et al. "PS-B-PHOST as a High X Block Copolymers for Directed Self Assembly: Optimization of Underlayer and Solvent Anneal Processes" Proc. SPIE 8680, Alternative Lithographic Technologies V. Apr. 2013. (10 Pages).

Johnston, D., et al. "Plasma Etch Transfer of Self-Assembled Polymer Patterns" Proc. of SPIE, vol. 8328, Advanced Etch Technology for Nanopatterning. Mar. 2012. (8 Pages).

Johnston, D., et al. "Plasma Etch Transfer of Self-Assembled Polymer Patterns" Journal of Micro/Nanolithography, MEMS, and MOEMS, vol. 11, Issue 3. Jul. 2012. (7 Pages).

* cited by examiner

GRAPHO-EPITAXY DSA PROCESS WITH DIMENSION CONTROL OF TEMPLATE PATTERN

RELATED APPLICATION INFORMATION

This application is a Continuation application of co-pending U.S. patent application Ser. No. 13/868,564 filed on Apr. 23, 2013, incorporated herein by reference in its entirety.

BACKGROUND

1. Technical Field

The present invention relates to semiconductor processing, and more particularly to methods for achieving high resolution resist structures for template formation for directed self-assembly (DSA) processing.

2. Description of the Related Art

Directed self-assembly (DSA) has emerged as a useful tool in semiconductor processing. DSA includes providing two materials and polymerizing them to concurrently form the materials into separate polymer regions. By providing physical guides, mandrels or templates, the polymers can be formed into useful structures, e.g., parallel lines and the like. DSA may be employed, e.g., to form interconnect lines, spacers and/or contacts.

DSA typically requires high-resolution templates to ensure proper formation of the DSA structures. However, present techniques yield large inaccurate resist features, which cannot form high resolution mandrels. Further, metal lift-off processes from resist features require metal deposition onto a neutral material layer leading to high defect levels and high line edge roughness (LER). Employing e-beam resists to form resist patterns on top of the neutral material layer is not a manufacturable lithographic technique useful for device production.

With these techniques or potential techniques, the height and profile of the resist tends to be poor at presently achievable and useful line widths, and these techniques may result in damage to the neutral material layer needed for the formation of DSA films and other structures.

SUMMARY

A method for defining a template for directed self-assembly (DSA) materials includes patterning a resist layer using optical lithography to form a template pattern on a stack including an anti-reflection coating (ARC) and a mask layer formed over a hydrophilic layer. The template pattern is formed by reactive ion etching the ARC and the mask layer to form template lines which are trimmed to less than a minimum feature size achievable by lithography. Hydrophobic spacers are formed on sidewalls of the template lines, and the spacers include a fractional width of the minimum feature size. A neutral brush layer is grafted to exposed portions of the hydrophilic layer. A DSA material is deposited between the spacers of the template lines. The DSA material is annealed to form material domains in a form of alternating lines of a first material and a second material wherein the first material in contact with the spacers includes a fractional size width less than a width of the lines. A metal is added to the alternating material domains to form an etch resistant material with the second material. The first material and the spacers are removed by reactive ion etching to form a DSA template pattern for etching underlying materials.

Another method for defining a template for directed self-assembly (DSA) materials includes forming a hydrophilic layer over a substrate; forming an optical planarization layer (OPL) on the hydrophilic layer; forming an anti-reflection coating (ARC) on the OPL; patterning a resist layer using optical lithography to form a template pattern on the ARC; forming the template pattern by reactive ion etching the ARC and the mask layer to form template lines which are trimmed to about 0.5 L where L is a minimum feature size achievable by lithography; forming hydrophobic spacers on sidewalls of the template lines, the spacers including a width of about 0.25L; grafting a neutral brush layer to exposed portions of the hydrophilic layer; depositing a DSA material between the spacers of the template lines; annealing the DSA material to form material domains in a form of alternating lines of a first material and a second material, the lines having a width of about 0.5L, wherein the first material in contact with the spacers includes a width of about 0.25L; adding a metal to the alternating material domains to form an etch resistant material with the second material; and removing the first material and the spacers by reactive ion etching to form a DSA template pattern for etching underlying materials.

Yet another method for defining a template for directed self-assembly (DSA) materials includes forming template lines by reactive ion etching an anti-reflection coating (ARC) and a mask layer and stopping on an underlying hydrophilic layer, which is formed over a semiconductor substrate; trimming the template lines to less than a minimum feature size (L) achievable by lithography by the reactive ion etching; forming hydrophobic spacers on sidewalls of the template lines, the spacers including a fractional width of the minimum feature size; grafting a neutral brush layer to exposed portions of the hydrophilic layer; depositing and annealing a DSA material including a block copolymer material, which is formed between the spacers of the template lines to create material domains in a form of alternating lines of a first material and a second material wherein the first material in contact with the spacers includes a fractional size width less than a width of the lines; selectively depositing a metal on the second material to provide etch resistance; removing the first material and the spacers by reactive ion etching to form a DSA template pattern for etching underlying materials; and etching the substrate to form structures for use in fabricating electronic devices.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 2:
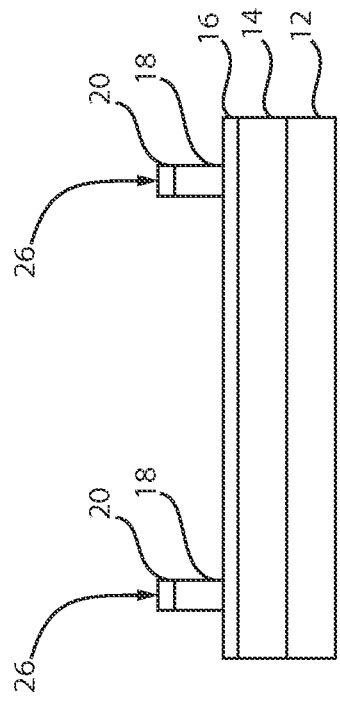
FIG. 2 is a cross-sectional view of the device of FIG. 1 after etching and trimming template lines formed from one of the mask layers and ARC layers in accordance with the present principles.

The present principles provide methods for forming templates with improved dimensional control. The templates may be provided for directed self-assembly (DSA) applications. In particularly useful embodiments, a dielectric stack is etched to form template lines. A substantially unreactive spacer is formed on sides of the template lines, which is employed to provide critical dimension control of the template line. DSA material is introduced between the spacers of the template lines and processed. A reactive ion etch (RIE) process may be employed to remove the spacers to provide an image reversed etch pattern for further etching, e.g., of a substrate or underlying layers.

In accordance with the present principles, an optical planarization layer (OPL)/silicon antireflection coating (ARC) stack may be patterned and combined with unreactive spacers (e.g., formed from a hydrophobic material with minimal hydroxyl groups) along sides of patterned stack. The patterned stack with spacers will be employed as template lines. DSA materials are provided and processed followed by the removal of the spacers using an image reversal RIE process. The present processes create high aspect ratio OPL template lines to control critical dimensions (CD) and to control formation of a neutral layer on which the DSA materials are coated to form a DSA pattern. The present methods employ image reversal of grapho-DSA patterns to generate a uniform line and space (L/S) grating.

It is to be understood that the present invention will be described in terms of a given illustrative architecture having a wafer or substrate; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present principles may be employed in integrated circuit chips. A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
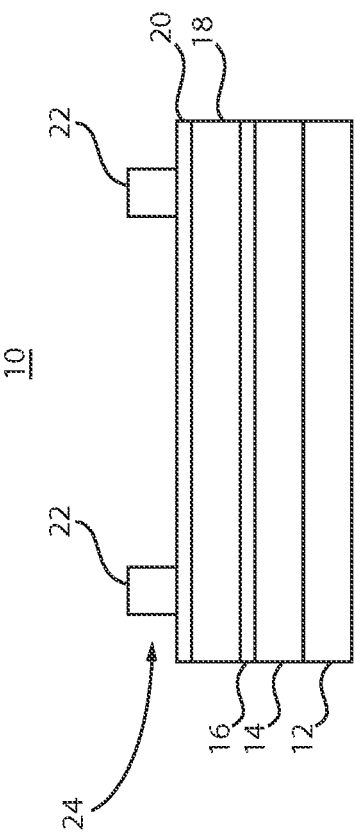
FIG. 1 is a cross-sectional view of a partially fabricated semiconductor device including a substrate having a stack of alternating mask layers and anti-reflection coatings (ARC) with a patterned resist for etching the stack in accordance with the present principles.

Referring now to the drawings in which like numerals represent the same or similar elements and initially to FIG. 1, a partially fabricated semiconductor device 10 is depicted for formation of direct self-assembly (DSA) materials in accordance with an illustrative embodiment. The device 10 will be subjected to an illustrative grapho-epitaxy flow. However, it should be understood that different structures, layers and materials may be employed in accordance with the present principles. To provide a high-resolution resist template (e.g., lines less than about 25 nm in width, and preferably less than about 15 nm), a directed self-assembly (DSA) mandrel needs to be defined using a lithographic method that also is compatible with the DSA material layer. The process creates high resolution templates for DSA, and can control the height and profile of the DSA template.

In one embodiment, a lithographic stack is formed on a substrate 12 and is employed to ensure high resolution. The substrate 12 is provided having an optical planarization layer 14 formed thereon. The substrate 12 may include a semiconductor substrate, such as e.g., silicon, silicon germanium, germanium, GaAs, etc. The substrate 12 may be employed for forming fin field effect transistors (finFETs) or other electronic devices, e.g., diodes, transistors, capacitors, etc. Other materials may be employed for the substrate 12 as well, e.g., ceramics, etc. depending on the application. A hard mask layer, such as an antireflection coating (ARC) 16 is formed on a mask layer 14 by, e.g., a spin coating processes. The ARC 16 may include Si ARC (SiARC), although other ARC materials may be employed. The mask layer 14 may include an optical planarization layer (OPL). OPL may be spun on and baked, or can be deposited by chemical vapor deposition (CVD). OPL 14 can be baked at lower temperatures, such as 150-200 degrees C., if desired.

A second mask layer (OPL) 18 is formed on the SiARC 16 by a similar process as OPL 14, and a second hard mask layer (SiARC) 20 is formed on the OPL 18 by a similar process as SiARC 16. A resist layer 24 is spin coated over a surface of SiARC 20, and patterned by known lithographic processes to form pattern shapes (lines) 22. The resist lines 22 are configured such that, upon etching in the next step, reduced line sizes are achieved.

Referring to FIG. 2, the resist lines 22 are employed as an etch mask to etch through the SiARC 20 and OPL 18. The etch process preferably includes a reactive ion etch (RIE). The RIE is employed with a chemistry and power to remove the unprotected portions of the SiARC 20 and OPL 18, and portions 26 of the SiARC 20 and OPL 18 that are protected by the resist lines 22 (FIG. 1) are reduced in width during etching to a critical dimension (CD) (e.g., minimum feature size for lithographic processing or less). The etching stops on the SiARC 16. Here, the target CD is about 0.5L where L is the minimum feature size line width. The remaining portions 26 form template lines for a DSA template.

Figure 3:
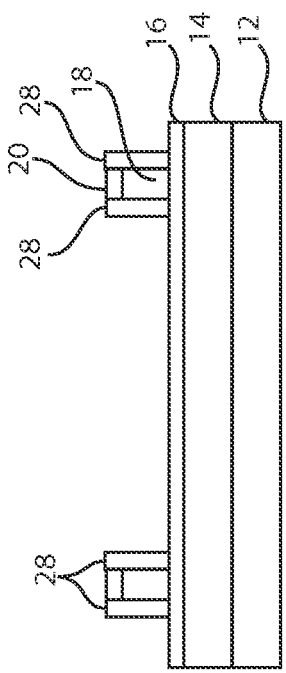
FIG. 3 is a cross-sectional view of the device of FIG. 2 after forming hydrophobic spacers on the template lines in accordance with the present principles.

Referring to FIG. 3, a spacer layer is deposited and etched (RIE) to form sidewall spacers 28. The material of the spacers 28 includes a hydrophobic material and may include an organic material. Materials for the spacers 28 may include parylene, a flouropolymer, etc. The spacers 28 are formed to include a thickness of about 0.25L. The two spacers 28 and the width of the line 26 provide a total of 1L in width. These spacer dimensions are selected to compensate for a 0.25L CD feature at an edge of the template as will be described in further detail hereinafter.

The RIE of the spacer layer is performed using a chemistry chosen to avoid generating reactive groups on the spacers 28. The chemistries may include, e.g., hydrogen or fluorine chemistries. This helps in maintaining the hydrophobic nature of the spacer materials as the number of hydroxyl groups are minimized. In addition, an anneal, such as an $N_2$ or Ar anneal, may be performed before breaking vacuum to quench reactive sites on the spacers 28 (and SiARC 16). It should be noted that the etching of the SiARC 16 and SiARC 20 produces many surface hydroxyl groups making the SiARCs 16 and 20 hydrophilic.

Figure 4:
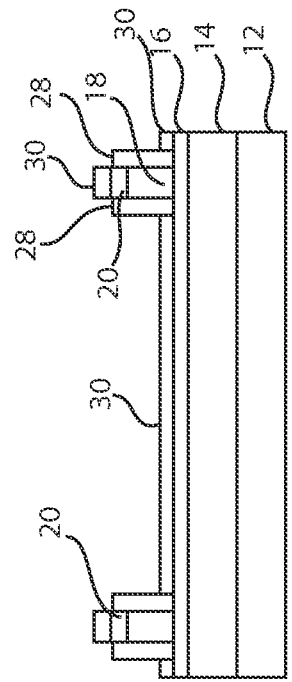
FIG. 4 is a cross-sectional view of the device of FIG. 3 after forming a neutral brush layer in accordance with the present principles.

Referring to FIG. 4, a neutral brush layer 30 is deposited on the SiARCs 16 and 20. The neutral brush layer 30 may include any known neutral brush material. The neutral brush layer 30 is selectively grafted on the hydrophilic surfaces of the SiARCs 16 and 20. A bake or anneal is then performed to stabilize the brush layer 30, followed by a rinse.

Figure 5:
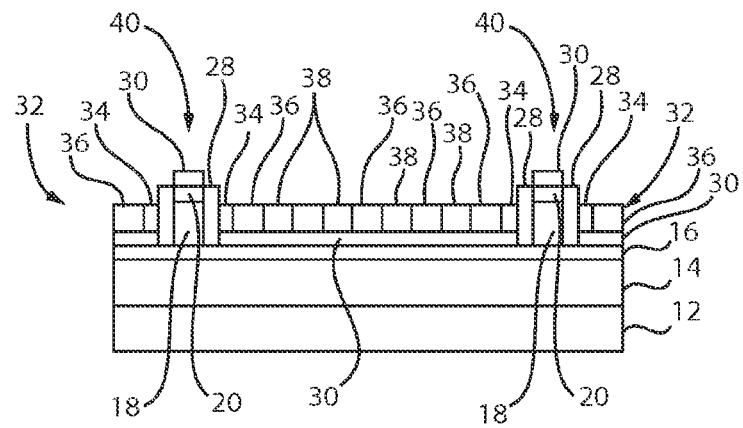
FIG. 5 is a cross-sectional view of the device of FIG. 4 after forming direct self-assembly materials between the spacers in accordance with the present principles.

Referring to FIG. 5, a DSA material 32 is formed over the neutral brush layer 30. In one embodiment, the DSA material 32 includes block copolymer (BCP), which may include polystyrene (PS)-poly(methyl methacrylate) (PMMA) (e.g., poly(styrene)-b-poly(methyl methacrylate)) diblock copolymers (PS-b-PMMA)), poly(styrene)-block-poly(hydroxystyrene) diblock copolymers (PS-b-PHOST) and/or other DSA materials.

In accordance with one useful embodiment, the BCP 32 includes a mixture of PS and PMMA or PS and PHOST. The DSA material 32 may be spun onto the neutral brush layer 30 or otherwise be dispensed to coat the surface of the neutral brush layer 30. One advantage of the present method includes the formation of structures or lines 26 for the template that have a sufficient height to act as a partition between adjacent volumes of the DSA material 32.

In one embodiment, the DSA material 32 includes a lamellar forming block copolymer (BCP) for directed self-assembly, which is grapho-epitaxially aligned by template lines 26 with spacers 28 to create topographical patterns (e.g., simple line structures). The hydrophobic spacers 28 are used to maintain critical dimensions, and also provide a tendency for the PS to form adjacent to the spacers 28 at a fractional width dimension (regions 34) of that of the DSA lines that will form. Regions 34 may naturally form at 0.25L, when the 0.25 L spacer is added to this value, the desired total of 0.5L is achieved. The DSA material 32 is subjected to an anneal process. The anneal process may include a temperature of about 175 to 240 degrees C. for between about 2 to 5 minutes. The anneal process causes the PMMA or PHOST and PS material to solidify into separate domains. The domains have a linear configuration or pattern with alternating regions 36, 38. In one embodiment, region 36 includes PMMA material or PHOST material, and regions 38 include PS material. The regions 36 and 38 repeat across the allotted width provided between structures 40, which include the template lines 26 and spacers 28. Adjacent to the spacers 28, regions 34 at the edge of the template include the PS material as 0.25L lines. For the regions 36 and the regions 38, both include a width of 0.5L.

Figure 6:
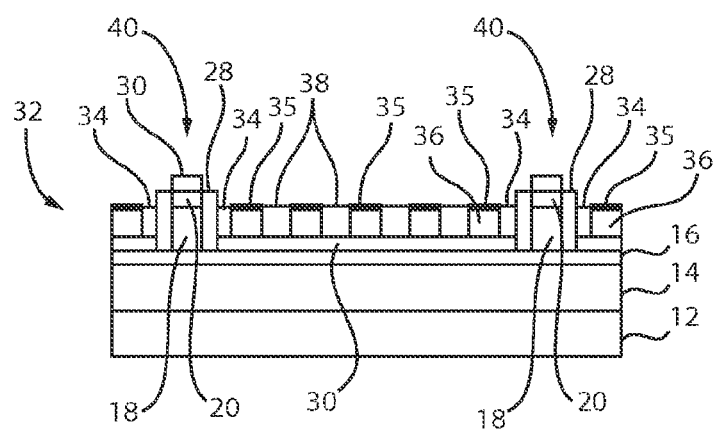
FIG. 6 is a cross-sectional view of the device of FIG. 5 after forming a metal selective to one domain of the annealed direct self-assembly materials in accordance with the present principles.

Referring to FIG. 6, a metal 35 is deposited over the BCP 32. The metal 35 preferably includes Al or Ti although similar metals may be employed. The metal 35 may be deposited by an atomic layer deposition (ALD) process. Examples of ALD reactant species are tetrakis (dimethylamido) titanium or trimethylaluminum for the deposition of Ti and Al, respectively. As known in the art, other similar types of Ti and Al reagents could also be employed, such as amido, ethyl or hydride functional groups. The metal 35 reacts with the PMMA or PHOST in regions 36 to form titanium or aluminum components. The metal 35 does not react with the PS in regions 38. The metal modified regions 36 will now be resistant to RIE processing and the regions 38 will not.

In one example, the ALD deposition selectively grows an etch barrier directly on the surface of one of the polymer blocks to enhance etch resistance and permit relief pattern formation via plasma etching. For example, ALD may be employed to directly grow titania ($TiO_2$) onto the surface of PHOST domains in PS-b-PHOST thin film phase separated patterns. The $TiO_2$ layer and the PS domains that do not grow titania permit selective removal of the PS domain of regions 34, 38 with plasma etching (e.g., oxygen plasma). The selective ALD grows films with tetrakis (dimethylamido) titanium, which provides growth of $TiO_2$ on PHOST in regions 36 while the PS in regions 34, 38 have no $TiO_2$ growth. Thin $TiO_2$ layers, e.g., 1 nm-10 nm, provide etch resistance against oxygen plasmas to permit highly anisotopic block removal of the PS regions 34, 38 in DSA patterns. Although thicker or thinner layers may be employed.

Figure 7:
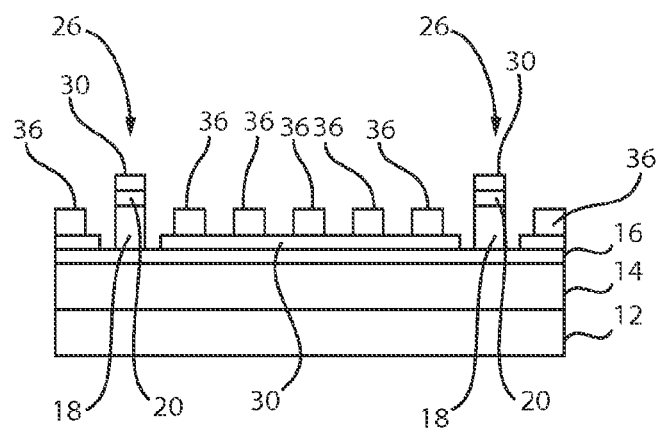
FIG. 7 is a cross-sectional view of the device of FIG. 6 after etching away the spacers and one domain of the direct self-assembly materials to create a DSA template for further etching in accordance with the present principles.

Referring to FIG. 7, RIE is performed to remove regions 38 and spacers 28. The RIE process is resisted by the regions 36, which have been metalized to prevent etching. The RIE process preferably includes an oxygen plasma or an $N_2/H_2$ chemistry to etch styrene in regions 38 and organic materials of the spacers 28. The RIE process leaves a reverse image pattern that can be employed for etching into underlying layers.

A DSA pattern 50 is now formed that includes evenly spaced lines having 0.5L width and 0.5L spaces therebetween to provide a uniform L/S pattern. The template lines 26 may be employed as part of the template pattern as well since these lines are evenly positioned within the uniform L/S pattern. The pattern 50 may now be employed to etch portions of layer 30, layer 16 and/or layer 14. In addition, the etch may continue into substrate 12. Layers 16 and 14 are optional and may not be present; therefore, the DSA pattern 50 may be employed to directly etch the underlying substrate 12 or any underlying layer(s).

The accurate dimensioning needed to provide feature sizes of 25 nm and less is not easily achievable using conventional lithography, and needs accurately defined template structures to ensure proper formation of DSA patterns and their resulting etched structures. The present approach, as described above, provides sharp, accurate features with sufficient height (aspect ratio) and uniformity to achieve the 25 nm or smaller (15 nm or less) feature sizes, which can be employed in forming finFETs or other devices. It should be understood that the fractional line widths presented herein are illustrative and that other fractional amounts of the minimum feature size achievable with lithography may be employed. With conventional techniques, the height and profile of the resist tends to be poor at presently achievable and useful line widths, and these techniques may result in damage to the neutral material layer needed for the formation of DSA films and other structures.

Figure 8:
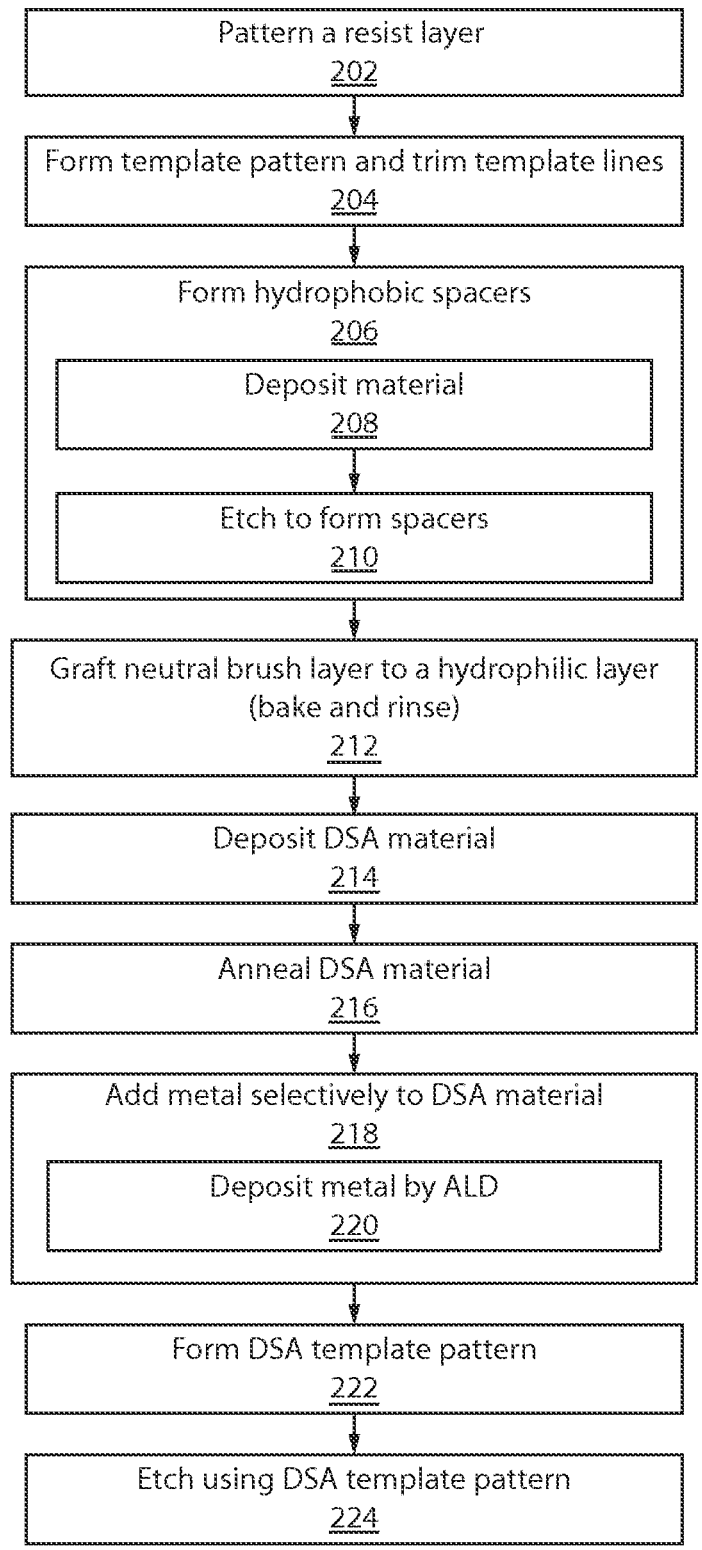
FIG. 8 is a block/flow diagram showing methods for defining a template for directed self-assembly materials in accordance with one illustrative embodiment.

Referring to FIG. 8, methods for defining a template for directed self-assembly (DSA) materials are illustratively shown. It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 202, a resist layer is patterned using optical lithography to form a template pattern on a stack. The stack includes an anti-reflection coating (ARC) and a mask layer formed over a hydrophilic layer. The hydrophilic layer may include an underlying ARC layer, e.g., SiARC. Other layers, e.g., mask layers, such as an optical planarization layer may also be employed. In block 204, the template pattern is formed by reactive ion etching the ARC and the mask layer to form template lines which are trimmed to less than a minimum feature size achievable by lithography. The trimmed width may include a width of about 0.5L.

In block 206, hydrophobic spacers are formed on sidewalls of the template lines. The spacers include a fractional width of the minimum feature size. In one embodiment, if the template lines include a width of about 0.5L, the spacers include a width of about 0.25L and the first material in contact with the spacers includes a width of about 0.25L. The hydrophobic spacers may include depositing an organic material in block 208 and reactive ion etching the organic material to form the spacers in block 210.

In block 212, a neutral brush layer is grafted to exposed portions of the hydrophilic layer. The neutral brush layer may include styrene (St), methyl methacrylate (MMA), and an initiator with a hydroxyl functional group that can react with a surface on which the neutral brush layer is grafted. Crosslinkers may include glycidyl methacrylate (GMA), 2-hydroxyethyl methacrylate (HEMA), benzocyclobutene (BCB) and/or azide ($N_3^-$). Other neutral materials for the neutral brush layer may include Si, $Si_3N_4$, $Ti_3N_4$, Al, Au, Pt, $SiO_2$, etc. or combinations thereof to provide a neutral surface or surfaces to induce oriented domains in block copolymer films. A bake process may include temperature ranges from about 130 degrees C. to 250 degrees C., and process times may vary from 1 minute to 24 hours. Ultraviolet (UV) irradiation may be also used in some cases to facilitate the process. A rinse is also performed.

In block 214, a DSA material is deposited between the spacers of the template lines. The DSA material preferably includes a block copolymer material, which may include PS-b-PMMA or PS-b-PHOST. In block 216, the DSA material is annealed to form alternating material domains forming lines of a first material and a second material wherein the first material in contact with the spacers includes a fractional size width less than a width of the lines. The anneal process may include a temperature of about 175 to 240 degrees C. for between about 2 to 5 minutes.

In block 218, a metal is added to the alternating material domains to form an etch resistant material with the second material. The metal may include, e.g., Ti or Al, and may be selectively deposited by, e.g., atomic layer deposition in block 220.

In block 222, the first material and the spacers are removed by reactive ion etching to form a DSA template pattern for etching underlying materials. The DSA template pattern may include lines having a width of about 0.5L, and spaces between the lines having a width of about 0.5L to provide a highly uniform L/S grating. The template lines may include a same line width and spacing as the lines and spaces in the DSA template pattern, and may be employed as part of the etch mask along with the DSA material mask structures.

In block 224, underlying materials that may be etched include other mask layers, ARCs, the substrate, etc. In one embodiment, the DSA template mask is employed to etch lines for conductive wires, finFETs, or other components or device.

Having described preferred embodiments for grapho-epitaxy DSA process with dimension control of template pattern (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for defining a template for directed self-assembly (DSA) materials, comprising:

forming a template pattern on a stack, the stack including an anti-reflection coating (ARC) and a mask layer formed over a hydrophilic layer;

forming the stack into template lines and exposing portions of the hydrophilic layer underneath the stack;

forming hydrophobic spacers on sidewalls of the template lines;

grafting a neutral brush layer to exposed portions of the hydrophilic layer;

depositing a DSA material between the spacers of the template lines and causing the DSA material to form material domains in a form of alternating lines of a first material and a second material, wherein the first material being in contact with the spacers includes a fractional size width less than a width of the lines;

making the second material etch resistant; and removing the first material and the spacers to form a DSA template pattern for etching underlying materials.

2. The method as recited in claim 1, wherein the hydrophilic layer includes a silicon anti-reflection coating (SiARC).

3. The method as recited in claim 1, further comprising trimming the template lines to less than a minimum feature size achievable by lithography.

4. The method as recited in claim 1, wherein the template lines include a width of about 0.5L, the spacers includes a width of about 0.25L and the first material in contact with the spacers includes a width of about 0.25L, where L is the minimum feature size.

5. The method as recited in claim 1, wherein the DSA template pattern includes lines having a width of about 0.5L, and spaces between the lines having a width of about 0.5L.

6. The method as recited in claim 1, wherein forming hydrophobic spacers includes depositing an organic material and reactive ion etching the organic material to form the spacers.

7. The method as recited in claim 1, wherein depositing a DSA material includes depositing a block copolymer material.

8. The method as recited in claim 7, wherein depositing the block copolymer material includes depositing one of a poly(styrene)-block-poly(methyl methacrylate) diblock copolymer (PS-b-PMMA)) and a poly(styrene)-block-poly(hydroxystyrene) diblock copolymer (PS-b-PHOST).

9. The method as recited in claim 1, wherein making the second material etch resistant includes adding a metal by atomic layer depositing one of Ti or Al.

10. The method as recited in claim 1, wherein the template lines include a same line width and spacing as the lines and spaces in the DSA template pattern.

11. A method for defining a template for directed self-assembly (DSA) materials, comprising:

forming a template pattern on a stack, the stack including an anti-reflection coating (ARC) and a mask layer formed over a hydrophilic layer;

forming the stack into template lines and exposing portions of the hydrophilic layer underneath the stack;

forming hydrophobic spacers on sidewalls of the template lines;

grafting a neutral brush layer to exposed portions of the hydrophilic layer;

depositing a DSA material between the spacers of the template lines;

annealing the DSA material to form material domains in a form of alternating lines of a first material and a second material, the lines having a fractional width of L, wherein the first material in contact with the spacers includes a width of about one half the fractional width, where L is a minimum feature size achievable by lithography;

adding a metal to the alternating material domains to form an etch resistant material with the second material; and removing the first material and the spacers to form a DSA template pattern for etching underlying materials.

12. The method as recited in claim 11, wherein the hydrophilic layer includes a silicon anti-reflection coating (SiARC).

13. The method as recited in claim 11, wherein the DSA template pattern includes spaces between the lines having a width of about 0.5L.

14. The method as recited in claim 11, wherein forming hydrophobic spacers includes depositing an organic material and reactive ion etching the organic material to form the spacers.

15. The method as recited in claim 11, wherein depositing a DSA material includes depositing a block copolymer material.

16. The method as recited in claim 15, wherein depositing the block copolymer material includes depositing one of a poly(styrene)-block-poly(methyl methacrylate) diblock copolymer (PS-b-PMMA)) and a poly(styrene)-block-poly(hydroxystyrene) diblock copolymer (PS-b-PHOST).

17. The method as recited in claim 11, wherein adding a metal includes atomic layer depositing one of Ti or Al.

18. The method as recited in claim 11, wherein the template line includes a same line width and spacing as the lines and spaces in the DSA template pattern.

19. The method as recited in claim 11, further comprising trimming the template lines to less than a minimum feature size achievable by lithography.

20. The method as recited in claim 11, wherein the fractional width is about 0.5L, wherein the first material in contact with the spacers includes a width of about 0.25L.

* * * * *